(12) United States Patent
Whittaker

(10) Patent No.: US 7,550,853 B2
(45) Date of Patent: Jun. 23, 2009

(54) ELECTRICAL ISOLATION OF MONOLITHIC CIRCUITS USING A CONDUCTIVE THROUGH-HOLE IN THE SUBSTRATE

(75) Inventor: Dennis Whittaker, Tampa, FL (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 0 days.

(21) Appl. No.: 11/869,817

(22) Filed: Oct. 10, 2007

(65) Prior Publication Data

US 2009/0096065 A1    Apr. 16, 2009

(51) Int. Cl.
*H01L 23/48* (2006.01)
*H01L 23/52* (2006.01)
*H01L 29/40* (2006.01)

(52) U.S. Cl. ............... 257/774; 257/778; 257/E21.577

(58) Field of Classification Search ............... 257/491, 257/686, 685, 723, 777, 758, 700, 774, E21.597, 257/E25.031, E25.032, E23.042, 621, 773, 257/786, 778, E21.38, E21.577, E21.585
See application file for complete search history.

(56) References Cited

U.S. PATENT DOCUMENTS

| | | | |
|---|---|---|---|
| 5,955,789 A | 9/1999 | Vendramin | |
| 6,747,216 B2 | 6/2004 | Brist et al. | |
| 7,045,412 B2 * | 5/2006 | Sugii et al. | 438/229 |
| 2006/0057793 A1 * | 3/2006 | Hatori et al. | 438/197 |
| 2007/0145489 A1 | 6/2007 | Yeh et al. | |
| 2008/0036061 A1 * | 2/2008 | Chainer | 257/686 |
| 2008/0067656 A1 * | 3/2008 | Leung et al. | 257/686 |

OTHER PUBLICATIONS

S. M. Sinaga et al., "On-Chip Isolation in Wafer-Level Chip-Scale Packages: Substrate Thinning and Circuit Partitioning by Trenches".
Tallis Blalack et al., "On-chip RF Isolation Techniques", IEEE BCTM, 2002, 12.1, pp. 205-211.

* cited by examiner

*Primary Examiner*—A. Sefer
*Assistant Examiner*—Dilinh P Nguyen
(74) *Attorney, Agent, or Firm*—Ratner Prestia

(57) ABSTRACT

A monolithic electronic chip including: a substrate; a first circuit formed on a first circuit portion of the substrate; a second circuit formed on a second circuit portion of the substrate; and at least one conductive impedance tap formed a through-hole in the substrate. The substrate includes first and second opposing surfaces and at least one through-hole extending from the first surface to the second surface. Each of the circuit portions is disposed on one or both of the opposing surfaces. Each conductive impedance tap is coupled to the surface of the through-hole it is formed in to electrically couple the substrate to a reference voltage. The impedance between each circuit and the reference voltage via the conductive impedance tap(s) is less than the crosstalk impedance between the first circuit and the second circuit via the substrate.

13 Claims, 4 Drawing Sheets

ELECTRICAL ISOLATION OF MONOLITHIC CIRCUITS USING A CONDUCTIVE THROUGH-HOLE IN THE SUBSTRATE

FIELD OF THE INVENTION

The present invention concerns electrical isolation of multiple circuits formed in monolithic electronic chips. In particular, the present invention allows for the monolithic production of systems on a chip using a single substrate.

BACKGROUND OF THE INVENTION

The demand for more and more complicated integrated circuits that may be monolithically formed on a single chip is driven by a desire for more compact electronic devices, as well as the potential for simplified post-fabrication assembly and packaging of these devices. Simplifying the assembly and packaging of electronic devices may improve durability and quality, as well as potentially decrease the cost of manufacture for the completed devices.

One difficulty that designers of such systems on a chip often face is ensuring proper electrical isolation between different circuits within these monolithic chips. In multi-chip designs, electrical isolation can be achieved by placing circuits that are likely to experience undesirable levels of crosstalk on separate electrically isolated substrates; however, in system on a chip designs, chip designers have no such luxury.

FIG. 1 illustrates this potential issue for a monolithically integrated system on a chip using single substrate 100. Circuits 102 and 104 represent two circuits that form part of the total system, but which desirably are electrically isolated from one another. For example, circuit 102 may be a radio frequency (RF) circuit and circuit 104 may be a digital baseband circuit. If impedance 106 though substrate 100 between circuit 102 and circuit 104 has a sufficiently high value, for both baseband and RF signals in this example, then these two monolithic circuits may operate without significant crosstalk; however, if impedance 106 has a low value, then undesirable levels of crosstalk are likely to occur during operation.

Reducing the doping of substrate 100 and/or increasing the separation distance between circuits 102 and 104 may increase the value of impedance 106; however, these relatively simple approaches often prove to be undesirable in ever shrinking circuit designs.

T. Blalack et al. describe a number of alternative approaches in ON-CHIP RF ISOLATION TECHNIQUES (IEEE Proceedings of Bipolar/BiCMOS Circuits and Technology Meeting 2002). These alternative methods include separating circuits with trenches, guard rings, shielding, capacitive decoupling and package inductance. In the first of these approaches, the trenches are cut through a low impedance buried layer so that the chip is held together by a significantly higher impedance layer that is not cut by the trenches. The low impedance buried layer is connected to a low impedance AC ground to act as a shield between the circuits. The guard ring and shielding approaches require forming a patterned layer of conductor(s) to reduce crosstalk between the circuits.

The present invention uses a new approach to isolate multiple circuits that are monolithically formed on a single substrate.

SUMMARY OF THE INVENTION

An exemplary embodiment of the present invention is a monolithic electronic chip including: a substrate; a first circuit formed on a first circuit portion of the substrate; a second circuit formed on a second circuit portion of the substrate; and at least one conductive impedance tap formed a through-hole in the substrate. The substrate includes first and second opposing surfaces and at least one through-hole extending from the first surface to the second surface. Each of the circuit portions is disposed on one or both of the opposing surfaces. Each conductive impedance tap is coupled to the surface of the through-hole it is formed in to electrically couple the substrate to a reference voltage. The impedance between the first circuit and the reference voltage via the conductive impedance tap(s) is less than the crosstalk impedance between the first circuit and the second circuit via the substrate. So is the impedance between the second circuit and the reference voltage via the conductive impedance tap(s).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following FIGS..

DETAILED DESCRIPTION OF THE INVENTION

Exemplary embodiments of the present invention include use of through-holes to provide electrical isolation between separate circuits formed on a single substrate.

Figure 1:
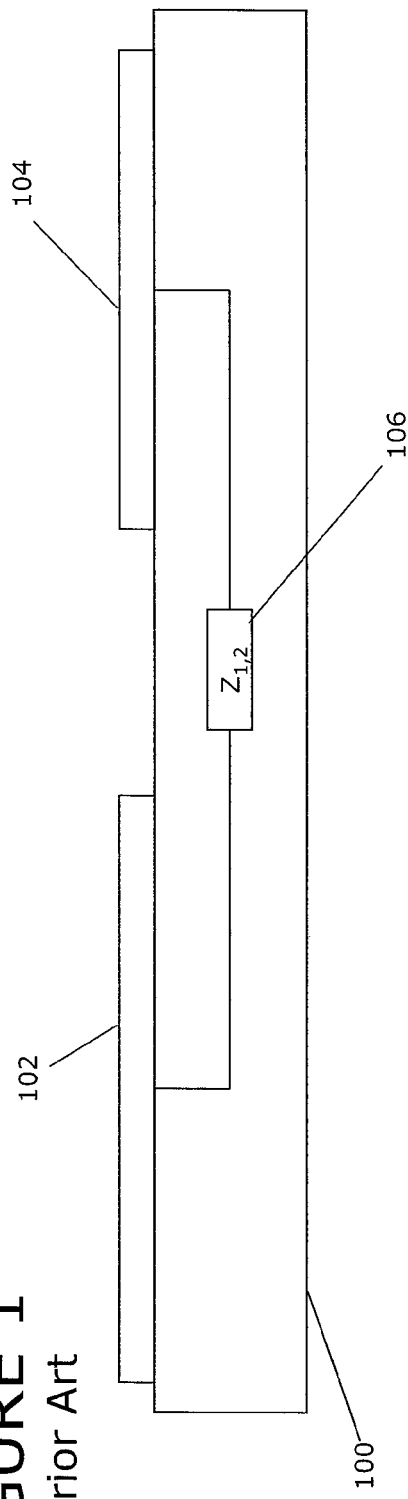
FIG. 1 is a side cut-away drawing illustrating a prior art monolithic electronic chip including two circuits.
Figure 2A:
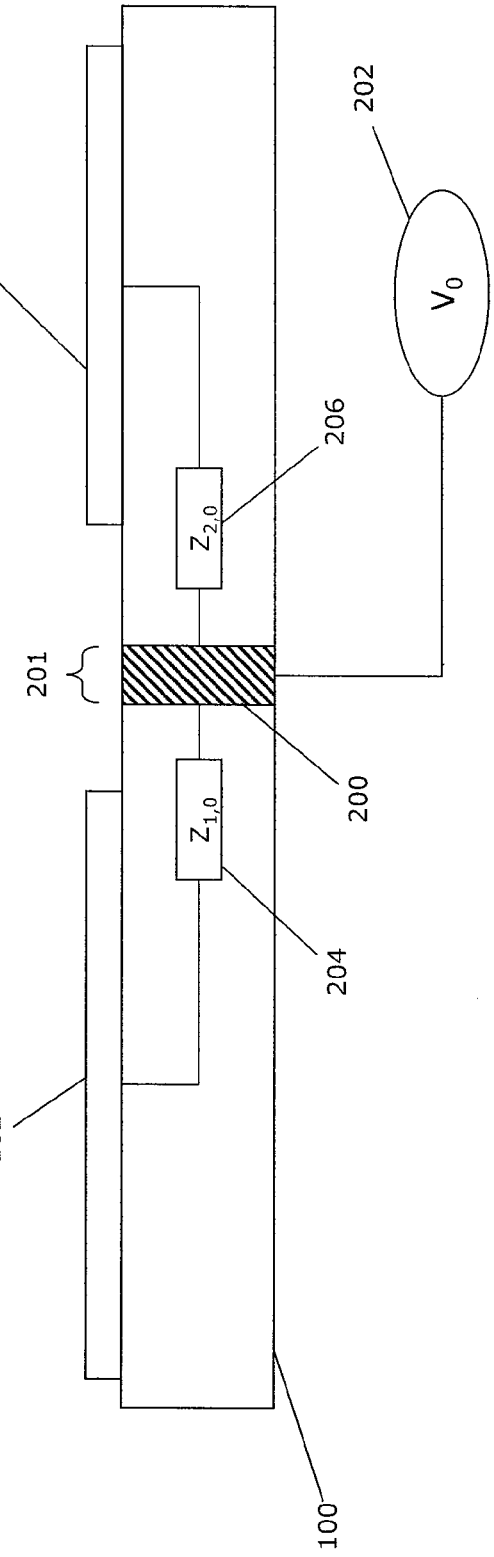
FIGS. 2A and 2C are side cut-away drawings illustrating exemplary monolithic electronic chips including two circuits with through-hole electrical isolation according to the present invention.
Figure 2B:
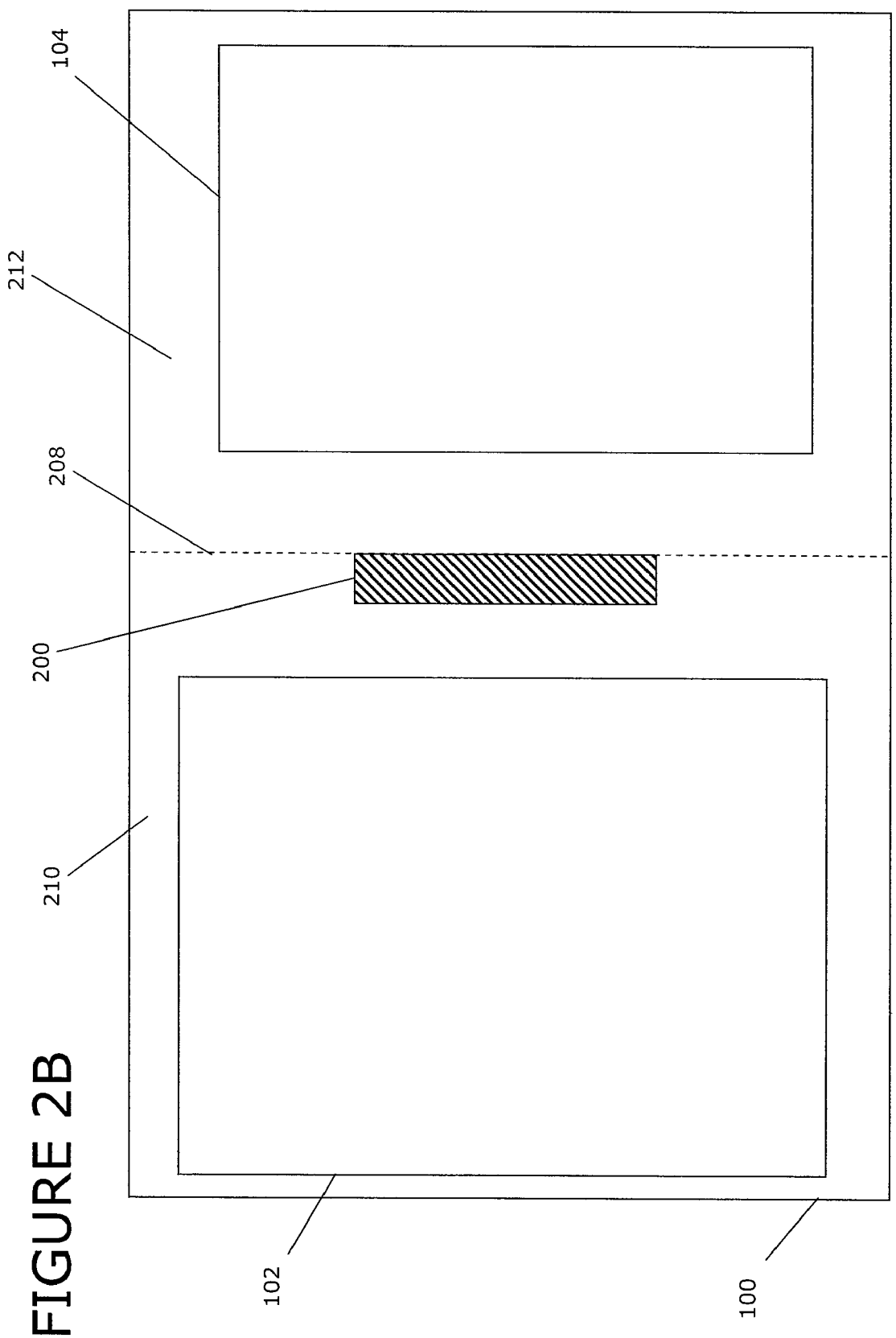
FIG. 2B is a top plan drawing illustrating an exemplary monolithic electronic chip including two circuits with through-hole electrical isolation as illustrated in FIGS. 2A and 2C.
Figure 2C:
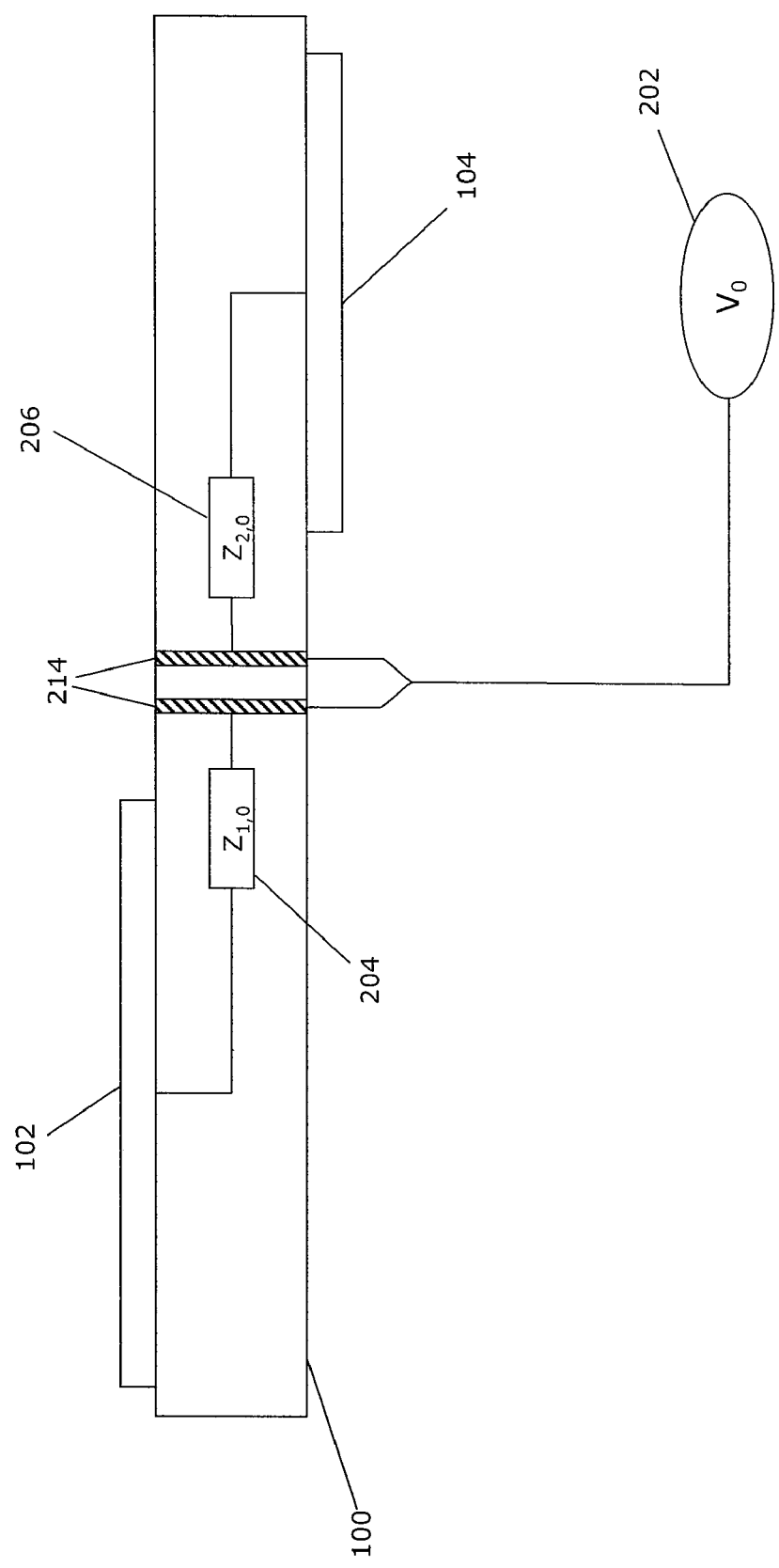

FIGS. 2A-2C illustrate exemplary monolithic electronic chips including two circuits with through-hole electrical isolation according to the present invention. This exemplary monolithic electronic chip includes: substrate 100, which has a through-hole, designated 201 extending from one surface to the other surface of the substrate; first circuit 102 and second circuit 104, which are each formed on at least one of the surfaces of substrate 100; and a conductive impedance tap (labeled as element 200 in FIGS. 2A and 2B and element 214 in FIG. 2C) formed within the through-hole in substrate 100. The conductive impedance tap (200 or 214) is coupled to the surface of the through-hole to electrically couple substrate 100 to reference voltage 202, which may be a ground reference. The through-hole is positioned and conductive impedance tap is coupled such that both impedance 204 between first circuit 102 and reference voltage 202 via the conductive impedance tap (200 or 214) and impedance 206 between second circuit 104 and reference voltage 202 via the conductive impedance tap (200 or 214) is less than crosstalk impedance 106 (only shown in FIG. 1) between first circuit 102 and second circuit 104 via substrate 100.

Substrate 100 may be include a variety of materials and may be formed as a bulk material or may be formed as a multi-layer structure. The material of substrate 100 may include an n-type semiconductor material or a p-type semiconductor material. Although it may be desirable for substrate 100 to have a relatively low resistivity so that it also provides a ground path for the circuits, a higher resistivity substrate may be used in the exemplary embodiments of the present invention.

Referring now to FIG. 2B, substrate 100 is shown separated by dashed line 208 into first circuit portion 210 and second circuit portion 212. Thus, dashed line 208 represents a boundary between first circuit portion 210 and second circuit portion 212 of the substrate. The through-hole 201 may desirably be located on or near, this boundary between first circuit portion 210 and second circuit portion 212. FIG. 2B shows one edge of the through-hole (which is filled by solid conductive impedance tap 200) as abutting boundary 208, while FIG. 3 illustrates an alternative exemplary embodiment in which a plurality of through-holes and solid conductive impedance taps 200, straddle the dashed lines representing the boundaries between different circuits.

Figure 3:
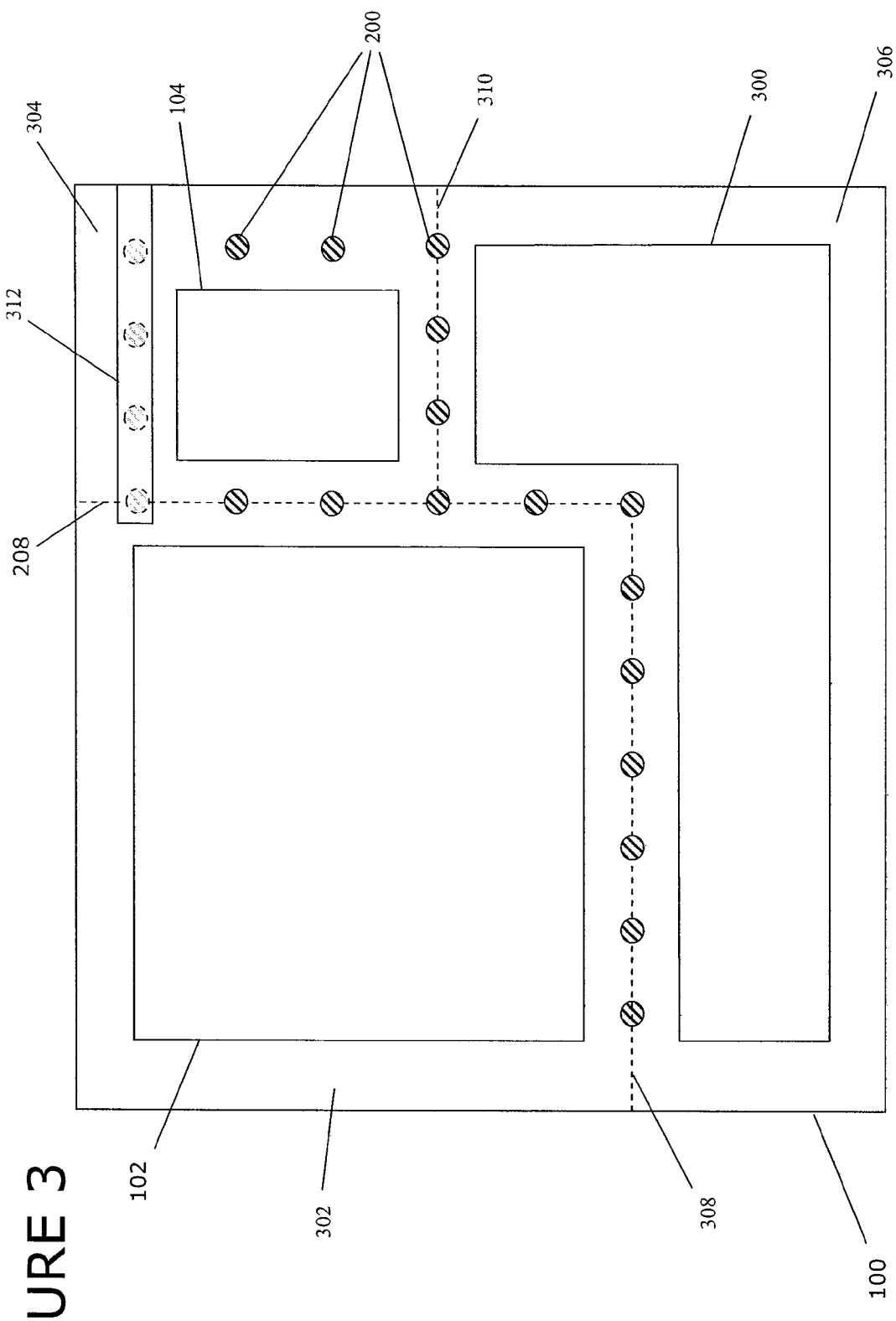
FIG. 3 is a top plan drawing illustrating an alternative exemplary monolithic electronic chip including three circuits with through-hole electrical isolation according to the present invention.

The through-hole(s) in substrate 100 may take a variety of prismatic shapes (including cylinders) with different cross-sections, such as the rectangular cross-section shown in FIG. 2B and the circular cross-sections shown in FIG. 3. Each conductive impedance tap may desirably fill the through-hole in which it formed, as illustrated by solid conductive impedance taps 200 in FIGS. 2A, 2B and 3; however, it is also contemplated that a conductive impedance tap may instead be formed as hollow conductive impedance tap 214, as shown in FIG. 2C. Although it may be desirable for the conductive impedance tap(s) (200 or 214) to be formed of metal, other conductive material, such as polysilicon or organic conductors, may be used as well.

In addition to showing hollow conductive impedance tap 214, FIG. 2C also illustrates an exemplary embodiment in which circuit 102 is formed on one surface of substrate 100 and circuit 104 is formed on the other surface. It is also contemplated that one or both circuits 102 and 104 may be formed on both surfaces of substrate 100.

Circuits 102 and 104 may be one of a variety of circuits, such as an RF circuit, an RF detection circuit, a microwave circuit, a microwave detection circuit, a digital baseband circuit, a logic circuit or a signal processing circuit.

FIG. 3 illustrates several exemplary embodiments of the present invention. The exemplary monolithic electronic chip of FIG. 3 includes three circuits 102, 104 and 300 that are electrically isolated from each other using a plurality of through-holes in substrate 100, including conductive impedance taps 200.

First circuit 102 is formed on first circuit portion 302 of substrate 100, second circuit 104 is formed on second circuit portion 304 of substrate 100 and third circuit 300 is formed on third circuit portion 306 of substrate 100. First circuit portion 302 and second circuit portion 304 are separated by boundary 208. First circuit portion 302 and third circuit portion 306 are separated by boundaries 208 and 308. Second circuit portion 304 and third circuit portion 306 are separated by boundary 310.

In this exemplary embodiment, the impedance between each circuit and the reference voltage via conductive impedance taps 200 is less than the crosstalk impedance between each pair of circuits via substrate 100. A plurality of through-holes 200 are substantially evenly spaced along each of these boundaries 208, 308 and 310 to electrically isolate circuits 102, 104 and 300. Additional through-holes are arranged around second circuit 104 such that conductive impedance taps 200 also form a two-dimensional Faraday cage around this circuit, providing additional electrical isolation between second circuit 104 and the other two circuits.

It is noted that all conductive impedance taps 200 in FIG. 3 are electrically coupled to a common reference voltage. These conductive impedance taps may also be shorted together either by one or more conductor(s) formed on one or both surface(s) of substrate 100, such as conductive strip 312, by wire bonds between conductive impedance taps 200, or by solder balls or other metal balls used in flip chip technology.

The present invention includes a number of exemplary embodiments of monolithic electronic chips, having multiple electrically isolated circuits. Although the invention is illustrated and described herein with reference to specific embodiments, it is not intended to be limited to the details shown. Rather, various modifications may be made in the details within the scope and range of equivalents of the claims and without departing from the invention. In particular, one skilled in the art may understand that many features of the various specifically illustrated embodiments may be mixed to form additional exemplary monolithic electronic chips also embodied by the present invention.

What is claimed:

1. A monolithic electronic chip comprising:
   a substrate including:
   first and second opposing surfaces;
   a first circuit having a first end disposed on at least one of the first or second opposing surfaces;
   a second circuit having a second end disposed on at least one of the first or second opposing surfaces; and
   at least two through-holes extending from the first surface to the second surface and positioned between the first and second ends;
   the at least two through-holes positioned so that the through-holes do not touch the first, second, or any other circuit;
   at least two conductive impedance taps, each conductive impedance tap formed within one of the at least two through-holes in the substrate and electrically coupled to a reference voltage;
   wherein:
   a first impedance value between the first circuit and the at least two conductive impedance taps via the substrate is less than a first-second crosstalk impedance value between the first circuit and the second circuit via the substrate;
   a second impedance value between the second circuit and the at least two conductive impedance taps via the substrate is less than the first-second crosstalk impedance value, and
   the first and second circuits are disposed in a monolithic semiconductor chip.

2. A monolithic electronic chip according to claim 1, wherein the substrate includes at least one of an n-type semiconductor material or a p-type semiconductor material.

3. A monolithic electronic chip according to claim 1, further comprises a third circuit, wherein:
   the substrate further includes a third circuit disposed on at least one of the first or second opposing surfaces;
   the first impedance value is less than a first-third crosstalk impedance value between the first circuit and the third circuit via the substrate;
   the second impedance value is less than a second-third crosstalk impedance value between the second circuit and the third circuit via the substrate;

a third impedance value between the third circuit and the at least one conductive impedance tap is less than the first-third crosstalk impedance value; and the third impedance value is less than the second-third crosstalk impedance value.

4. A monolithic electronic chip according to claim 1, wherein the at least two through-holes are located on a boundary between the first circuit and the second circuit on the substrate.

5. A monolithic electronic chip according to claim 1, wherein:

the at least two through-holes are a plurality of through-holes; and the at least two conductive impedance taps are a plurality of conductive impedance taps.

6. A monolithic electronic chip according to claim 5, wherein the plurality of through-holes are substantially evenly spaced along a boundary between the first circuit and the second circuit on the substrate.

7. A monolithic electronic chip according to claim 5, wherein the plurality of through-holes are arranged such that the plurality of conductive impedance taps form a two-dimensional Faraday cage around the first circuit.

8. A monolithic electronic chip according to claim 1, wherein each through-hole of the substrate has a substantially cylindrical shape.

9. A monolithic electronic chip according to claim 1, wherein:

the first circuit is disposed on the first opposing surface; and the second circuit is disposed on the first opposing surface.

10. A monolithic electronic chip according to claim 1, wherein the first circuit is one of:

a radio frequency (RF) circuit;

an RF detection circuit;

a microwave circuit;

a microwave detection circuit;

a digital baseband circuit;

a logic circuit; or a signal processing circuit.

11. A monolithic electronic chip according to claim 1, wherein the at least two conductive impedance taps are formed of a metal.

12. A monolithic electronic chip according to claim 1, wherein each conductive impedance tap fills the one through-hole in the substrate in which the conductive impedance tap is formed.

13. A monolithic electronic chip according to claim 1, wherein the reference voltage is a ground reference.

* * * * *